(12) United States Patent
Wang

(10) Patent No.: US 8,309,841 B2
(45) Date of Patent: Nov. 13, 2012

(54) UPRIGHT-PLATE TYPE SUNLIGHT GENERATOR

(76) Inventor: Cunyi Wang, Shaanxi (CN)

( * ) Notice: Subject to any disclaimer, the term of this patent is extended or adjusted under 35 U.S.C. 154(b) by 774 days.

(21) Appl. No.: 12/227,514

(22) PCT Filed: May 16, 2007

(86) PCT No.: PCT/CN2007/001585
§ 371 (c)(1),
(2), (4) Date: Nov. 19, 2008

(87) PCT Pub. No.: WO2007/134527
PCT Pub. Date: Nov. 29, 2007

(65) Prior Publication Data
US 2009/0173335 A1    Jul. 9, 2009

(30) Foreign Application Priority Data
May 19, 2006    (CN) .......................... 2006 1 0042841

(51) Int. Cl.
*H01L 31/042*    (2006.01)
(52) U.S. Cl. ........................ 136/251; 136/246
(58) Field of Classification Search ........................ None
See application file for complete search history.

(56) References Cited

U.S. PATENT DOCUMENTS

| | | | | |
|---|---|---|---|---|
| 4,085,733 A | * | 4/1978 | Bowles | 126/623 |
| 4,108,154 A | * | 8/1978 | Nelson | 126/576 |
| 4,690,355 A | * | 9/1987 | Hornung et al. | 244/172.8 |
| 6,372,978 B1 | * | 4/2002 | Cifaldi | 136/248 |

FOREIGN PATENT DOCUMENTS

| | | |
|---|---|---|
| CN | 87107688 A | 5/1988 |
| CN | 2557884 Y | 6/2003 |
| CN | 2685774 Y | 3/2005 |
| CN | 1808878 A | 7/2006 |
| WO | WO-00/55549 A1 | 9/2000 |

OTHER PUBLICATIONS

English abstract of WO 00/55549.*
International Search Report dated Aug. 9, 2007 for corresponding PCT application No. PCT/CN2007/001585.

* cited by examiner

*Primary Examiner* — Jonathan Johnson
*Assistant Examiner* — Shannon Gardner
(74) *Attorney, Agent, or Firm* — Mintz, Levin, Cohn, Ferris, Glovsky and Popeo, P.C.

(57) ABSTRACT

An upright-plate type sunlight generator comprises up-right-plate type photovoltaic generating tubes capable of automatically cleaning dust, collecting mirrors with the automatic storm-sheltering mechanisms and a collecting carrier, a cooling and radiating system, and an automatic sun-tracking machine and its object carrier. The collecting mirrors are the folding mirrors made up of plane mirrors, and are connected to the photovoltaic generating tubes provided in the focal strip of the group of collecting mirrors during the operation on the support of the collecting carrier. The collecting carrier is immovably connected to the object carrier of the automatic sun-tracking machine, and the object carrier is connected to the automatic sun-tracking machine. The cooling and radiating system includes a liquid-cooling cavity that is the internal cavity of the photovoltaic generating tube, flexible connecting pipes and a liquid storing and cooling member.

7 Claims, 11 Drawing Sheets

UPRIGHT-PLATE TYPE SUNLIGHT GENERATOR

FIELD OF THE INVENTION

The present invention relates to a solar photovoltaic (PV) power generation with high efficiency and low cost.

BACKGROUND OF THE INVENTION

In order to decrease the cost of the solar PV power generation and improve the efficiency of the photoelectric conversion, PV factories and the research institutes have spent a lot of time on improving the manufactory process and techniques, and found some more effective materials. However, the cost in the PV industry is relatively high, and the solar PV power generation still limits the commercial application though some achievements have been got.

As there is a massive waste in the use of solar PV cells, we find the great potential to the solar PV industry.

Firstly, most of solar PV power generating systems are in fixed state and work only 4 hours at peak even in a good whether condition, which is a waste to the solar PV power generation.

Secondly, in order to decrease the waste as described above, people have invented the automatic sun-tracking machine. By using this invention, the efficiency of the solar PV power generation can be increased by 40% (compared to the fixed position device facing south). After deducting the cost of automatic sun-tracking machine, the solar PV power generating system cost can only be decreased around 20%, which is nothing to improve the photoelectric conversion efficiency.

Thirdly, people try to use the high multiple light collecting technology and automatic sun-tracking to improve the conversion efficiency and decrease the cost, the above problems can be solved by this method but some new problems will happen:
1. the high multiple light collecting can only focus direct light, but not diffuse light;
2. the high temperature caused by the high multiple light collecting may decrease the efficiency of photoelectric conversion and shorten the use life of PV cells;
3. the non-planar mirrors used in the high multiple light collecting may cause the sunlight uneven, damage PV cells and decrease the conversion efficiency.

If we can solve the latter two problems described above, the high multiple light collecting will highly increase PV system efficiency and decrease the cost of PV cells in the rich direct solar light area, but the efficiency will be worse in the rich solar diffuse light area and to make the uneven solar light even after using the high multiple light collecting will increase the cost.

In addition, the present of "heat island effect" in current solar PV power generating system will decrease the efficiency of photoelectric conversion and the use life of PV cells. This is, when the solar PV system is exposed to the sunlight, the guano, leaves etc. stacking on the PV panel make the sunlight uneven, and the dust, dirty marks and snow in winter on the cells make the sunlight hitting proportion decrease and affect the efficiency of PV system.

SUMMARY OF THE INVENTION

In order to solve the problems described above, the present invention provides a new solar PV power generating technology which can realize automotive sunlight tracking and high concentration photovoltaic power generation, so as to save the PV cells consumption and decrease the system cost, and make the sunlight even; at same time not only high effectively utilize the direct sunlight and the diffuse light, but also realize the medium concentration PV power generation and decrease the working temperature of the solar cells under the environment temperature; and automatically clean the dust and snow to overcome the "heat island effect" which will damage the efficiency of the PV cells and the use life of the solar PV power generating system.

This invention combine the wind and solar PV power generating systems in order to decrease the cost of solar PV power generating system (e.g., controller, solar power generation converser, accumulator, inverter etc.), and make the solar power supply consistently.

The objects of the present invention are achieved by the technologies as follows:
1. An upright-plate type sunlight highly efficient generator comprises an upright-plate photovoltaic (PV) solar power generating tube which can automatically clean dust, a light collecting mirror and a collecting carrier which can automatically escape from the storm, a cooling and radiating system, an automatic sun-tracking machine and its object carrier, which is characterized in that:
   A. the collecting carrier is fixed in the object carrier which is connected movably to the automatic sun-tracking machine, wherein two connecting approaches between the collecting mirrors group and the collecting carrier or the object carrier are: movable hinged connection and fixed connection, the solar PV power generating tube in the focus area of the collecting mirrors group is supported by and connected to the collecting carrier during the working time;
   B. the collecting mirrors are the folding mirrors which consist of a group of flat mirrors;
   C. the cross section of the upright-plate PV power generating tube is wedge-shaped or rectangular or square, that is, at least two lines in the plane connecting to the solar PV cells plane which is parallel or nearly parallel to sunlight, wherein the upright-plate power generating tube has an empty inner chamber (internal cavity) called as "liquid cooling chamber" in which flows the cooling liquid, and at least two connectors at both ends of the tube for connecting to the top and bottom connectors of the reserving and radiating chamber respectively through two flexible connecting pipes;
   D. the hinged collecting mirrors consist of the collecting mirror components which is single component or the double components, and the collecting mirrors are provided with an automatic storm-sheltering mechanism;
   E. the hinged single mirror component consists of collecting mirror sheets and a restoring spring installed in main mirror frame, a stopper and a hinge shaft, the hinged single mirror component further comprises an anti-wind plate and an anti-shake system, the main mirror frame is connected to the collecting carrier by a hinge shaft, the restoring spring is connected to the collecting carrier and the main mirror frame respectively at both ends so as to make the stopper for hinging the hinged collecting mirrors in the proper working condition locate between the frame and the collecting carrier;
   the anti-wind plate moves the collecting mirrors to horizontal flat position so as to get a least wind resistance;
   F. the hinged double mirror components consist of main collecting mirror and sub-collecting mirror, the main mirror is the single collecting mirror described above which is hinged to the collecting carrier, the sub-collecting mirror is installed in the main collecting mirror and comprises mirror sheets installed in frame, the restoring spring, the hinge shaft, and the anti-shake system, wherein the sub-mirror frame is connected to the main mirror frame by a hinge, the restoring spring is connected to the main mirror and sub-mirror frames at both ends respectively; and G. the cooling and radiating system is a liquid cooling system which consists of a liquid cooling chamber, a flexible connecting pipe, and liquid reserving and cooling components, wherein at least two connectors is connected to the flexible connecting pipes at both ends of the liquid cooling chamber, and at least two flexible connecting pipes lie at the top and at the bottom, and wherein the connector between the bottom connecting pipe and the reserving and cooling component (liquid storing and cooling member) is higher than the vertex of the upright plate PV power generating tube, and the top and bottom connecting pipes are communicated with the media in the reserving and cooling components.

2. The two surfaces of the upright plate PV power generating tube are in a touchable or an untouchable state to a dust cleaner, and the dust cleaner comprises a cleaning component, clamping assemblies, a torque transmission component, drive assemblies, and a signal controller, and the cleaning component consists of a dust cleaning head, a carrying plate or a circle, wherein the cleaning head is made of flexible material with or without electric fuse, the clamping assemblies on one hand make a torque transmission connection with the carrier of the cleaning head so as to keep the cleaning head in touch with the PV cells at the working time, while on the other hand connect to the torque transmission component which consists of a position wheel and a rolling component at the two ends of the PV power generating tube, and wherein the torque transmission wheel is fixed at the axis of the position wheel which drives the rolling component move repeatedly and is located at one end of PV power generating tube, the torque transmission wheel makes a torque transmission connection with the drive assemblies which are controlled by the signal controller.

3. The anti-shake system is an empty chamber anti-shake system or a hydraulic anti-shake system or a spring anti-shake system, wherein the empty chamber system includes a waterloo chamber and a piston linked with and inserted inside the waterloo chamber, there are some small holes inside the chamber, or there is micro gap between the piston and the chamber, and wherein the piston is installed in a hinge support and the chamber is installed in a hinge linker, the hinge shaft will be the torque center;

the hydraulic anti-shake system is installed between the hinge support and the hinge linker, the hinge shaft may be fixed at the hinge support shaft or at the rotated shaft of the linker, and the hydraulic anti-shake system comprises a chamber shell, a baffle, a valve and a valve shell, wherein the baffle is fixed at the center shaft which is connected with the hinge support so that the chamber shell traverses to make a seal and unmovable connection with the center shaft, and contains parts of the baffle and the valve shell so as to make a seal and movable connection with the parts, and wherein the valve makes a movable connection with the valve shell which is the carrier of the valve, and the space between the valve and the baffle can be enlarged or reduced, and wherein the valve shell is fixed to the hinge linker so as to make a movable seal with the center shaft, and the working media is filled among the chamber shell, the center shaft and the valve shell; and optionally hydraulic anti-shake is an assembly that:

when the hinge linker is connected to the hinge support by the rotated shaft which is fixed with the hinge linker, as the baffle is fixed at the rotated shaft, the valve shell carrying the valve is fixed to the hinge support, the unmovable chamber shell which contains parts of the baffle and the valve shell becomes movable and constitutes an unmovable seal by fixing with the rotated shaft and a movable seal with valve shell, and the working media is filled among the chamber shell, shaft and valve shell; and the spring anti-shake system is installed between the hinge support and the hinge linker.

4. The automatic storm-sheltering mechanism comprises a driving component which may be a wind driven component or an electromagnetic driven component, wherein the wind driven component is either an dissymmetric configuration in the hinge shaft of the main mirror plate in the double mirror components, or an dissymmetric configuration in the hinge shaft of the collecting mirror in the single mirror component, in other words, the hinge linker is divided into different size parts by the hinge shaft, and wherein the sub-mirror in the double mirror components is connected to a small part of main mirrors with a hinge, the anti-wind plate in the single mirror component is connected to a part of collecting mirror with a hinge; and the electromagnetic driven component of the storm-sheltering mechanism is fixed to a PV panel, and comprises an electrical operated component and a wind sensors, and further comprises a controller having a self protective circuit in the strong wind, wherein the wind sensor, the controller and the electrical operated component are connected together by the electromagnetic signal, and the electrical operated component has a torque transmission connection with the object carrier of the automatic sun-tracking machine.

5. The liquid reserving and cooling component is a system for reserving the heat from the liquid and for exchanging the heat with liquid cooling chamber to cool it, wherein the reserving and cooling component is a chamber reserving and cooling component, or a evaporation reserving and cooling component, or a heat pump reserving and cooling component, or an adsorption reserving and cooling component, or a Peltier reserving and cooling component, or a day-night temperature difference reserving and cooling component, or an integrated reserving and cooling system.

6. The chamber reserving and cooling component is a chamber which reserves the liquid, radiates the heat and cools the liquid cooling chamber, wherein the chamber reserving and cooling component is the upper section of the support frame of wind power generator, called as reserving and radiating chamber, or is an outer reserving and cooling chamber located outside the support frame of the wind power generator; at least two flexible connecting pipes communicate the reserving and radiating chamber with the liquid cooling chamber, wherein one connecting pipe is connected to the reserving and radiating chamber at the bottom and is made of heat isolation material or is surrounded by heat isolation material, while another flexible connecting pipe is connected to the reserving and radiating chamber at the top;

the evaporation reserving and cooling component includes a reserving and radiating chamber and an evaporating chamber connected thereto, wherein the evaporating chamber is either carried by and surrounds the walls of the reserving and radiating chamber, and the evaporating chamber under the wind wheel has an open with the open area surrounding the walls of the reserving and radiating chamber in which the liquid flows, and wherein the evaporating chamber further comprises an outer evaporator outside the wind power generator;

the heat pump reserving and cooling component includes a heat pump, a cooling and heating chamber or a reserving and radiating chamber, a covering-uncovering component, a driving assembly, and a signal controller, wherein the cooling end of heat pump is connected to the media inside the reserving and radiating chamber or the cooling and heating chamber to transmit the heat, the radiating heat end of the heat pump must be located outside the reserving and radiating chamber or the cooling and heating chamber, the working media cycling inside the heat pump is connected to the driving assembly to transmit the torque, and wherein the driving assembly is an electrical compressor, or a power source and the switch of the Peltier circuit, or a heat transmission component with the repeat movement of magnetizating and demagnetizating, or an adsorptive or absorbing heat transmission component caused by heat, and wherein the covering-uncovering component has a touch or untouched connection with the walls of the cooling and heating chamber or the reserving and radiating chamber, the covering-uncovering component has a torque transmission with the driving assembly which is controlled by the signal controller;

the adsorption reserving and cooling component comprises an adsorption-desorbing chamber, a radiating condenser, and an evaporative cooler, a media, a heat absorption transmission component, and a covering-uncovering component, wherein the evaporative cooler under the adsorption-desorbing chamber and the radiating condenser is the lower frame chamber of the wind power generator or is an outer evaporative cooler outside the hollow column of the wind power generator, the adsorption-desorbing chamber in which there is adsorbent above the radiating condenser, and the working media correspond to adsorbent cycles inside above three ones connecting to each other, and wherein the adsorption-desorbing chamber either is carried by the sun-tracking machine to track sunlight or not, or is the flat box style anti-wind plate in the single collecting mirror, and wherein the covering-uncovering component is installed outside the evaporative cooler, and wherein the heat absorption transmission component is a heat exchanging component between the evaporative cooler and the reserving and radiating chamber;

the Peltier reserving and cooling component is made according to the Peltier cooling making theory, the matched different metal ends are connected electrically to form a circuit, where the electric current in the Peltier cold making theory flows, and wherein the cold-making end inside the reserving and radiating chamber or the cooling and heating chamber, while the heating end has a heat transmission with the upper section of the wind power generator or the direction tail wing or the wind wheel or the bottom of the automatic sun-tracking machine or other positions, the electrical current in the circuit is the residual current from the PV or wind power generator or from other solar power generating sources;

the day-night temperature difference reserving and cooling component includes a reserving and radiating chamber, a cooling and heating chamber, a covering-uncovering component, and a heat absorption transmission component, wherein the cooling and heating chamber may be a chamber of the lower frame of the wind power generator or a chamber outside the wind power generator which is called as the outer cooling and heating chamber; wherein the absorption transmission component is a heat exchanging component between the cooling and heating chamber and the reserving and radiating chamber, and is either a liquid cycle tube or is made of the high conductive material; and wherein the covering-uncovering component is installed around the reserving and radiating chamber or a cooling and heating chamber to cover and reserve heat or cool for them according their need, or to uncover them to absorb or radiate heat, the covering-uncovering component may be the isolation absorptive covering-uncovering component or a rotary vane covering-uncovering component or a push-pull covering-uncovering component or a rolling covering-uncovering component; and the integrated reserving and cooling system is a reserving and cooling system by any combination of two or more types of evaporative reserving and cooling component, ordinary heat pump or absorptive reserving and cooling component, or Peltier reserving and cooling component, metal hydride reserving and cooling component and day-night different temperature reserving and cooling component.

7. The absorptive covering-uncovering component includes a horizontal up-right plate, an absorptive plate, a rounding ring, a flexible force transmission component, and a driving assembly, and the absorptive covering-uncovering component further includes a signal controller, a sensor and a rolling component, wherein the horizontal up-right plate hinges to the walls of the cooling and heating chamber or the reserving and radiating chamber, and moveably connects with isolation absorptive plate which prevents the heat transmission between the walls of the cooling and heating chamber or the walls of the reserving and radiating chamber and the environment, and become a radiator of the walls of the cooling and heating chamber or the reserving and radiating chamber, or become a heat absorption from the outer environment when the temperature of the heat absorptive end of the heat pump is very low, there are open holes which have windows in both sides and support and connect the heat isolation material at the front of the isolation absorptive plate, the back of the plate has a touchable or untouchable connection with the walls of the cooling and heating chamber or the reserving and radiating chamber, the plate is connected to the rounding ring by the flexible spring, and the rounding ring has inner or outer rings which connect to each other, the inner ring is carried by and rotated surrounding the walls of the cooling and heating chamber or the reserving and radiating chamber, the outer ring has a direct or indirect torque transmission connection with the driving assembly by the torque transmission component, the driving assembly is controlled by the signal controller or sensor;

the rotary vane covering-uncovering component comprises a heat isolation support plate, a heat isolation layer, a rolling component, a rounding ring, a torque transmission and a driving assembly, or a signal controller, or a horizontal up-right plate, wherein the heat isolation support plate is directly or indirectly connected to the walls of the cooling and heating chamber or the reserving and radiating chamber or by the horizontal up-right plate, on the other hand, the heat isolation support plate which supports and spreads the heat insulation layer is connected to the rounding ring by the rolling component, the heat isolation support plate is called as a heat isolation vane, and wherein the rounding ring includes inner ring and outer edge, the inner ring is carried by the walls of the cooling and heating chamber or the reserving and radiating chamber and can move around the latter, the rounding ring has a direct or indirect torque transmission connection with the driving assembly by a torque transmission component, the driving assembly is controlled by the signal controller or sensor;

the rolling covering-uncovering components are divided into two types, wherein the first type includes a heat isolation layer, an original tube, a sub-tube, a sub-column and a driving assembly, or a rolling component and a signal controller, wherein the original tube is movably connected to and can move around the walls of the cooling and heating chamber or the reserving and radiating chamber, and wherein the sub-column is parallel to the axis center line of the cooling and heating chamber or the reserving and radiating chamber, the sub-tube moves around the sub-column, one end of the heat isolation layer is fixed surrounding the original tube, and is connected to the other end of the rolling component when one end of the rolling component is fixed at the original tube, and the other end of the heat isolation layer is fixed surrounding the sub-tube, the torque transmission wheels connected to the original tube and the sub-tube have a torque transmission connection with the driving assembly which is controlled by the signal controller;

the second type of the rolling covering-uncovering component comprises a heat isolation layer, a sub-column, a sub-tube, a rolling component, a driving assembly, and a signal controller, wherein one end of the heat isolation layer is connected to the rolling component, and the other end surrounds and is fixed at the walls of the cooling and heating chamber or the reserving and radiating chamber, and the other end of heat isolation layer is fixed with the sub-tube or the walls of the sub-tube after connecting to the rolling component and surrounding the sub-tube, the sub-tube moves around the sub-column, and the sub-tube is fixed at the torque transmission wheel which has a torque transmission connection with the driving assembly which is connected to the signal controller; and the push-pull covering-uncovering component includes a plurality of heat isolation petals, a pull assembly, a rolling tube and a driving assembly, or an active signal generator, wherein the pull assembly makes the heat isolation petal get a fixed timing movement by the driving assembly, and includes an internal fixity, a spring, a rolling component, an external fixity, and a pulley, wherein, one end of the spring is connected to the heat isolation petals, the other end is connected to the internal fixity, and one end of the rolling component is connected to the heat isolation petals, the other end is surrounding the pulley which is installed in the external fixity and is connected directly or indirectly to the rolling tube, or wherein in another pulls system, one end of the spring is connected to the external fixity, the other end is connected to the heat isolation petals, and one end of the rolling component is connected to the heat isolation petals, the other end is fixed at the rolling tube directly or indirectly after surrounding the pulley, the rolling tube has a torque transmission connection with the driving assembly, and wherein the driving assembly and the signal generator can be an integrated system, or be a separated system in which the driving assembly is connected to the signal generator by a signal; the internal fixity is the nearest fixity to the reserving and radiating chamber, while the external fixity is a relative farer one.

8. The electromagnetic driving assembly of the anti-wind system which is fixed to the collecting mirror comprises a wind driven sensor of the electrical driving component, a controller having an automatic protection from the storm, wherein the wind sensor, the controller and the electrical driving component are connected with each other by the electromagnetic signals, and the electrical driving component has a torque transmission connection with the object carrier of automatic sun-tracking machine.

9. The upright-plate type sunlight highly efficient generator according to the above solutions, when necessary, can further comprise a reconstructed wind power generator.

DETAILED DESCRIPTION OF THE EMBODIMENTS

Figure 1:
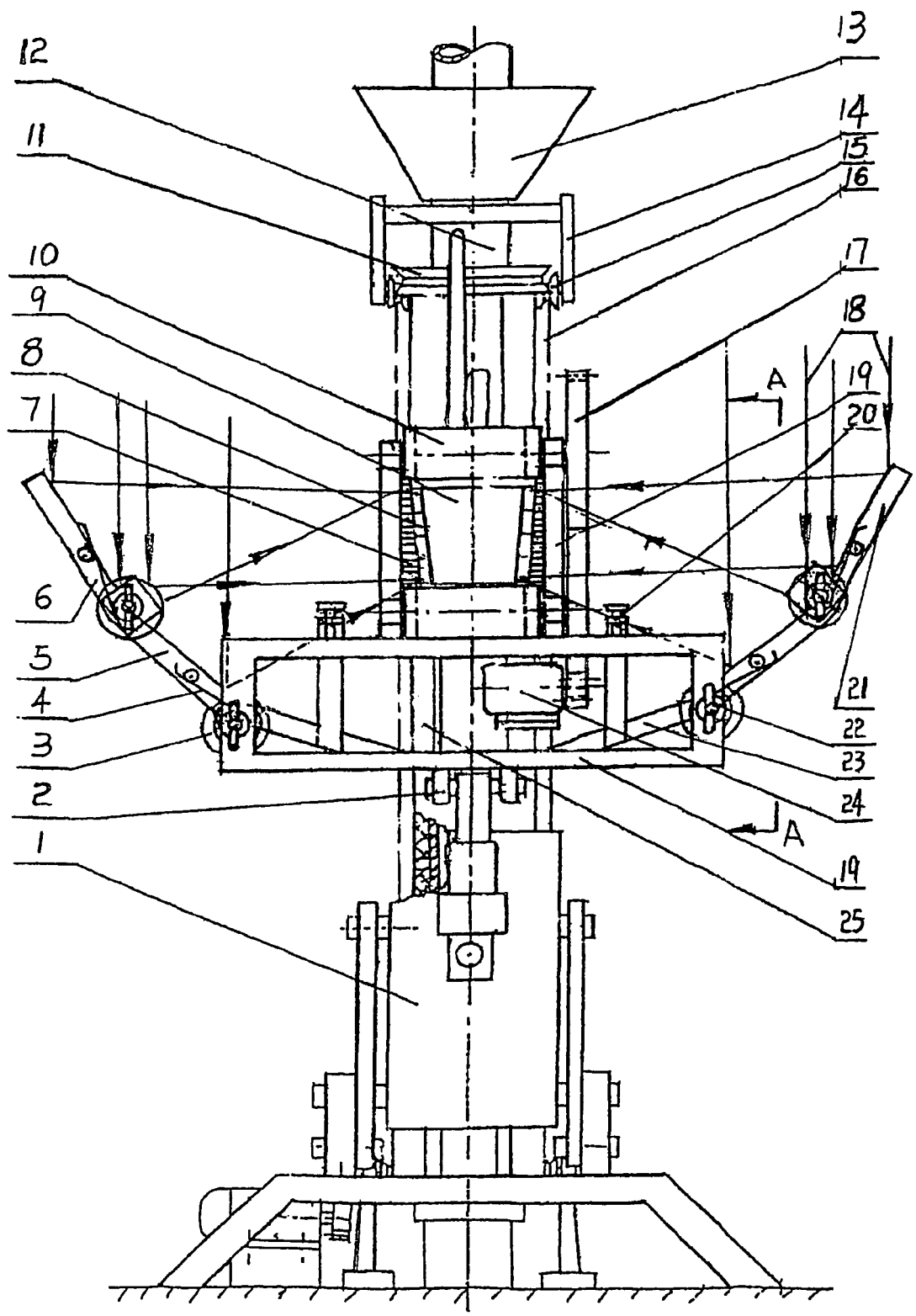
FIG. 1 is the front view of the first embodiment according to the present invention.
Figure 2:
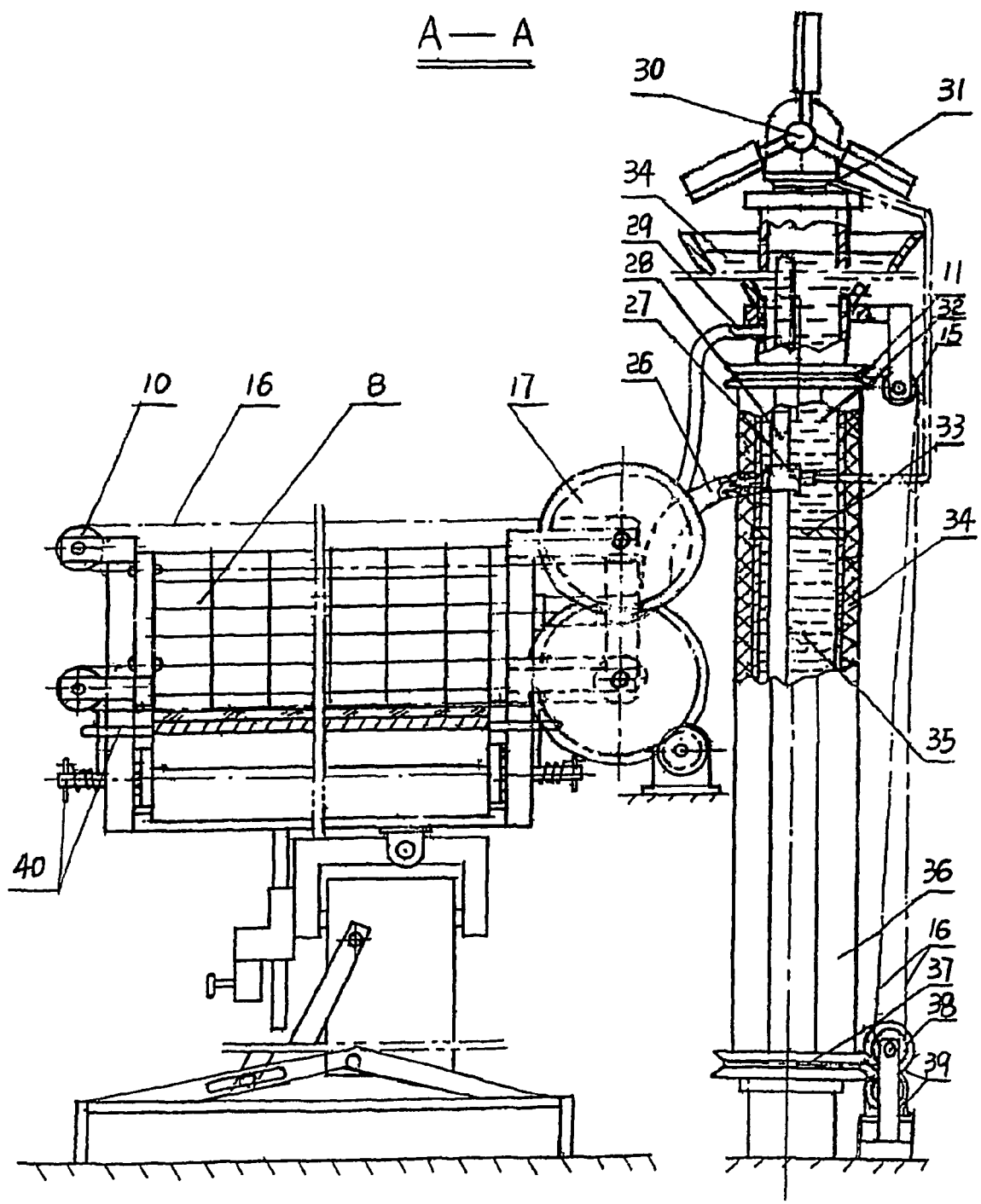
FIG. 2 is the right side view of FIG. 1.

In FIGS. 1 and 2, reference number "1" is representative of the automatic sun-tracking machine; reference number "2" is the horizontal automatic tracking part of the sun-tracking machine; reference number "3" is the hydraulic anti-shake component; reference number "4" is the spring; reference number "5" is main sunlight collecting mirror which consists of flat reflective mirror and is connected to the collecting carrier 19 with a hinge shaft 22; reference number "6" is a west sub-collecting mirror hinged to the main sunlight collecting mirror 5; reference number "7" is a dust cleaning component for cleaning the dust, guano, leaves etc on the PV panel 8; reference number "9" is representative of the upright-plate PV power generating tube simply called "generating tube", its two ends are fixed to the collecting carrier and the PV cells panel (as the cells panel is not vertical to the sunlight, so called "upright plate generator") in any side of the generating tube is illuminated by the reflective sunlight from different flat mirrors, at least two connectors at each end are connected to the lower flexible connecting pipe 26 and the upper flexible connecting pipe 29, and the top ends of these two flexible connecting pipes are connected to the reserving and radiating chamber 32, the top connector of the flexible connecting pipe 26 is higher than the highest position of the upright plate power generating tube, and the lower flexible connecting pipe 26 is surrounded by the soft heat isolation material, in an inner empty chamber (liquid-cooling cavity) inside the upright plate power generating tube flows the cycle flowing media for cooling the PV panel; reference number "10" is representative of the position wheels at both ends of upright plate power generating tube, the rolling component for transmitting the torque surrounds the wheels and is connected to the dust cleaning component, the torque transmission wheels 17 fixed to the upper and lower shaft of the position wheels at each ends of PV generating tube has a torque transmission connection with the driving assembly 24 so as to drive the dust cleaning component moving repeatedly and cleaning the PV panel at the fixed time in one day, a clamping device between the dust cleaning components at both side of PV generating tube ensures a good connection between the cleaning head and the PV panel; reference number "11" is a rounding ring for changing the function of the heat isolation vane; reference number "12" is a frame of wind power generator or a hollow support column 46; reference number "13" is a evaporation chamber; reference number "14" is the upper support frame; reference number "15" is a pulley; reference number "16" is a rolling component which is used to transmit the torque from the driving component-electrical motor 39 with a gearbox to the rounding ring 11 via the gearbox and the rolling tube 38; reference number "17" is a torque transmission wheel; reference number "18" is representative of two beams of sunlight incident on the neighboring flat mirrors; reference number "19" is a collecting carrier; reference number "20" is a stopper; reference number "21" is the east sub-mirror; reference number "22" is a hinge shaft; reference number "23" is the main reflective mirror; reference number "24" is an electrical motor; reference number "25" is an object carrier; reference number "26" is a lower flexible connecting pipe; reference number "27" is a heat absorbed end of Peltier circuit; reference number "28" is a heat absorption transmission component; reference number "29" is an upper flexible connecting pipe; reference number "30" is a wind wheel; reference number "31" is a heat radiation end of Peltier circuit; reference number "32" is a reserving and radiating chamber and relevant media; reference number "33" is an isolation plate; reference number "34" is a heat isolation layer; reference number "35" is a cooling and heating chamber; reference number "36" is a covering-uncovering component; reference number "37" is a lower rounding component; reference number "38" is a rolling tube; reference number "39" is a driving component (i.e., electrical motor) with gearbox; reference number "40" is a spring pile.

In FIG. 1, the symmetry axis (plane) of the upright plate power generating tube in respect to PV cells is parallel to the sunlight when the sun-tracking machine in the working state. The parallel reflected sunlight from the each flat mirror covers roundly the corresponding PV panel, and the sunlight from a lot of flat mirrors is gathered on the PV cells panel, so that the mirror is called as the collecting mirror. Since the light intensity from the collecting mirror is even over the uneven light intensity from the paraboloid mirror or Fresnel lens, the collecting mirror without any uniform light device has a bigger sunshine surface in the PV cells panel to receive the diffuse sunlight of half sky from the reflective mirrors, so that the temperature is very high after sunlight collecting, which may decrease the efficiency of light-electricity conversion. In order to increase the PV efficiency and decrease the relevant cost, the cooling liquid in the cooling chamber (i.e., the chamber of the upright plate power generating tube) must flows.

In FIG. 2, the hollow support column (i.e., the frame of wind power generator) is divided to two cavities by the isolation plate 33, wherein the upper chamber is the reserving and radiating chamber, and the lower chamber is the cooling and heating chamber. The low temperature liquid in the reserving and radiating chamber flows into the liquid cooling chamber via the lower flexible connecting pipe, and The high temperature liquid flows into the upper section of the reserving and radiating chamber. The heat will be radiated out by the evaporation chamber 13, on the other hand, the low temperature section of the cooling chamber can absorb the heat from the reserving and radiating chamber by heat absorption transmission component which includes a solid heat conductive component, or a liquid or gas cycling heat conductive component. The covering-uncovering component 36 is used to make the reserving and radiating chamber or the cooling and heating chamber refrigerate and keep cold, for example, by the day-night temperature difference. At night, the signal controller (not shown, such as a timer, actuates the electrical motor 39 to drive the covering-uncovering component 36 uncover the heat isolation layer 34, so as to decrease the media temperature inside the reserving and radiating or the cooling and heating chamber to the lowest temperature. While when the sun rises in the morning, the signal controller actuates the electrical motor 39 to drive the heat isolation layer cover the reserving and radiating or the cooling and heating chamber to protect the heat in-flowing from the outer environment in the daytime. When the temperature of the reserving and radiating chamber 32 is higher than the environmental temperature in the daytime, the sensor and signal controller actuates the electrical motor 39 to drive the heat isolation layer 34 outside the reserving and radiating chamber 32 uncovered and radiate.

Figure 3:
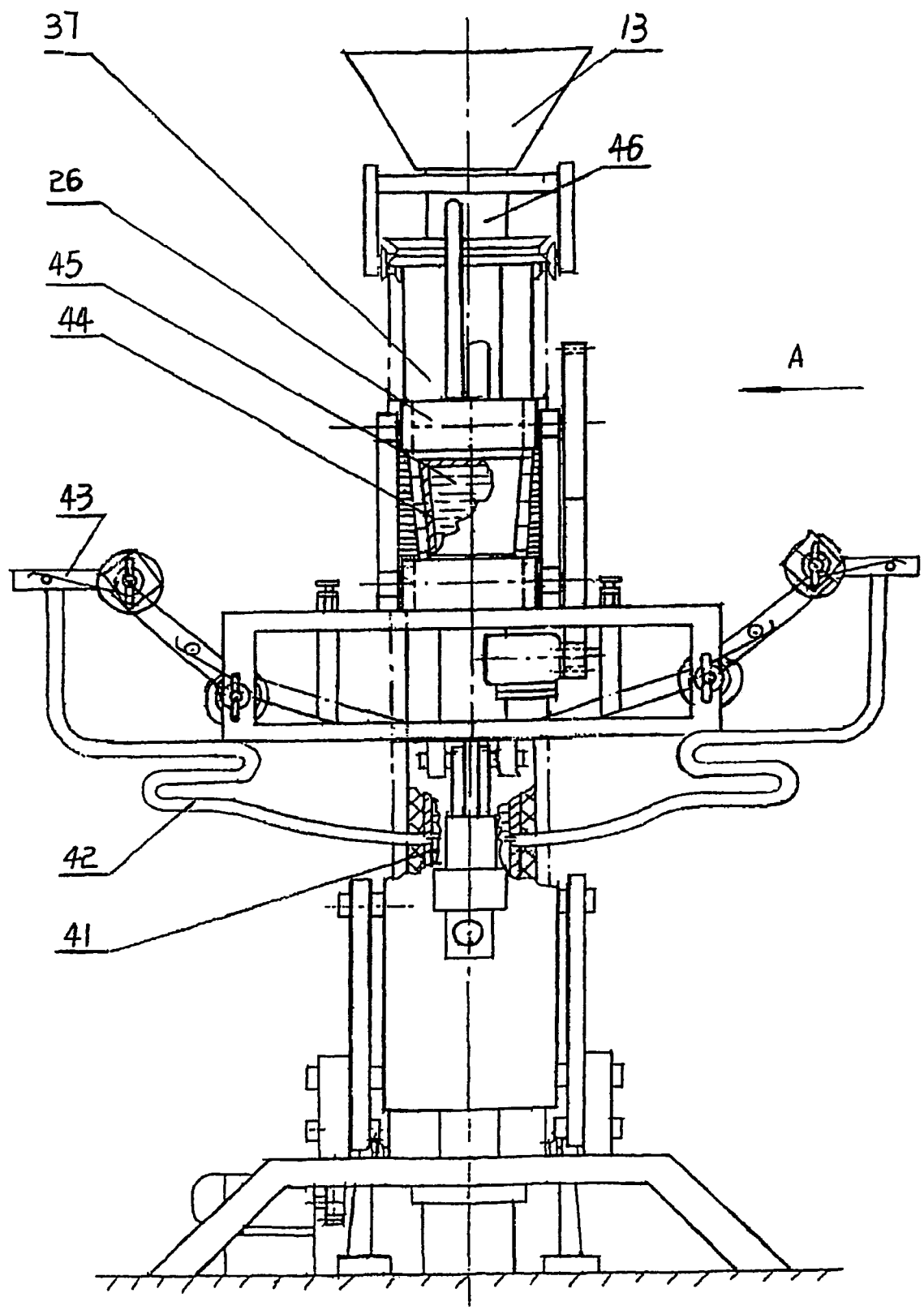
FIG. 3 shows the second embodiment having an integrated absorption reserving and cooling system according to the invention.

FIG. 3 is the front view of this invention with adsorption reserving and cooling system. In FIG. 3, reference number "41" is an evaporation cooling chamber (i.e., a cooling chamber in which the media must correspond to the absorbent); reference number "42" is a cooling radiator; reference number "43" is an adsorption-desorbing chamber (i.e., a flat antiwind plate which is vertical to the sunlight) where there is adsorbent such as zeolite inside. The above three components are communicated and sealed, so that the media (for example, water) flows circularly inside to make ice or cold water by utilizing the temperature difference between day and night to use the solar power to desorb and to use the cooling power to adsorb during the night; reference number "44" is the walls of upright plate power generating tube; reference number "45" is the media inside the generating tube or the liquid cooling chamber; reference number "46" is a hollow support column specifically for cooling without a wind wheel.

Figure 4:
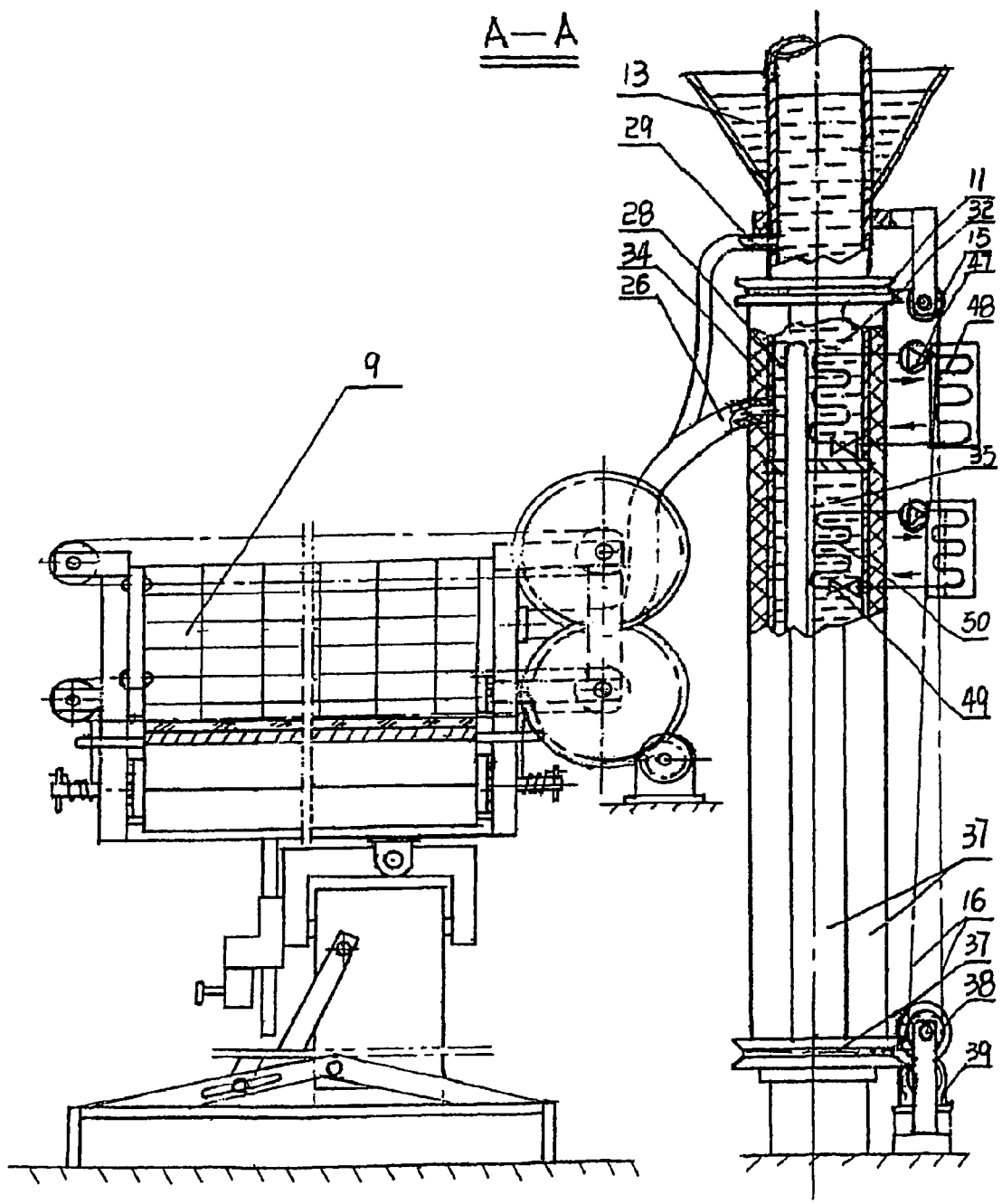
FIG. 4 shows the third embodiment with the system containing a heat pump and having synchronous generation function to heat and solar power generation according to the invention.

FIG. 4 shows the system with an ordinary heat pump and the synchronous generating function to heat and solar power generation according to this invention. In this figure, reference number "47" is the compressor of the heat pump; reference number "48" is the heat production end of the heat pump in heat consumption devices; reference number "49" is an expansion valve; reference number "50" is the evaporation cooling end of the heat pump inside the reserving and radiating or the cooling and heating chamber. Many collecting mirrors reflect the sunlight to the PV cells panel, part of the energy become electrical power, wherein most of the energy increases the temperature of the media inside the liquid cooling chamber, and then the media flows into the reserving and radiating chamber, the heat is absorbed by the heat pump and transferred to the heat consumption device for producing heat or increasing temperature. On the other hand, the heat pump can cool the reserving and radiating chamber and the cooling and heating chamber, and the cooler media will flow into the liquid cooling chamber and greatly increase the solar power generation efficiency of PV cells. For the enthalpy content of the hot water is much higher than that of atmosphere, so the efficiency of heat production is higher.

Figure 5:
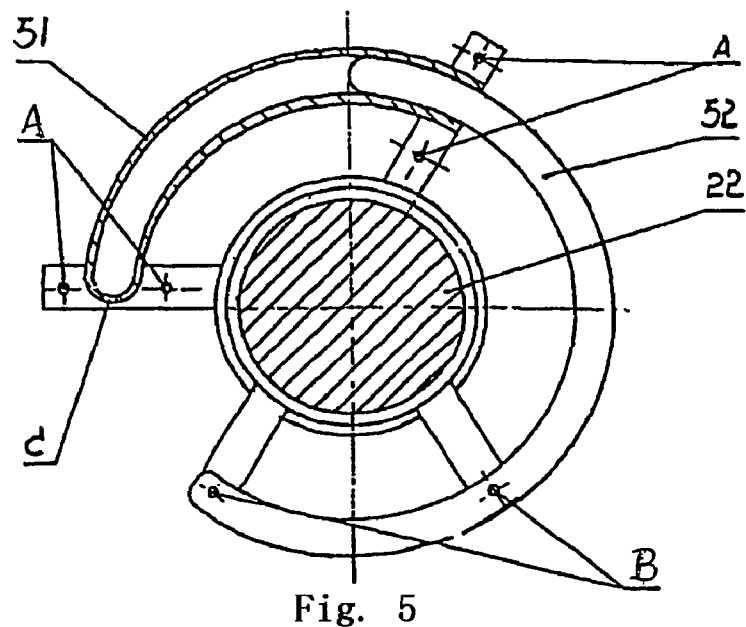
FIG. 5 shows the fourth embodiment with the chamber anti-shake system according to the invention.

FIG. 5 is to the chamber anti-shake system which can be used for the hinged collecting mirrors. Reference number "51" is a slippery chamber, reference number "52" is a piston, "C" is representative of the pores of the slippery chamber. These pores will not be made if there is proper micro gap for the piston sliding into the slippery chamber. In FIG. 5, 4 holes A and 2 holes B are used for the installation of the hinge linker and hinge supporter, and the piston and slippery chamber are both in ring shape. Alternatively, the piston and slippery chamber may be straight and accordingly a system which can transfer straight movement to circular movement must be added.

Figure 6:
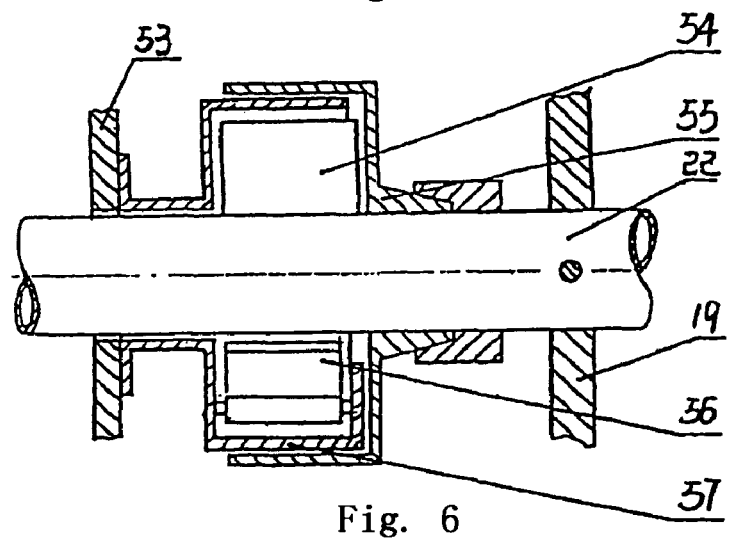
FIG. 6 shows the fifth embodiment with the hydraulic anti-shake system according to this invention.

FIG. 6 is a structural figure of the hydraulic anti-shake system. In this figure, a plate 54 is installed in the hinge shaft 22, and the hinged shaft 22 is installed in the collecting carrier 19, the chamber shell 55 makes a sealed connect with the hinged shaft 22, the piston 56 has a moveable connect with the piston shell 57 which is fixed in the collecting mirror frame 53, and the collecting mirror frame 53 and the piston shell 57 have a moveable seal with the hinged shaft 22 and the chamber shell 55. The media is injected into the empty chamber formed by the chamber shell 55, the piston shell 57 and the hinged shaft 22. The valve 56 opens and the media flows back when the collecting mirror frame meets a destructive storm to revolve with the collecting mirror to elude wind, and there is nearly no resistant to the above revolve. When the media flows back slowly from the gap, the collecting mirrors 53 will revolve slowly and reset so that there is no shake.

Figure 7:
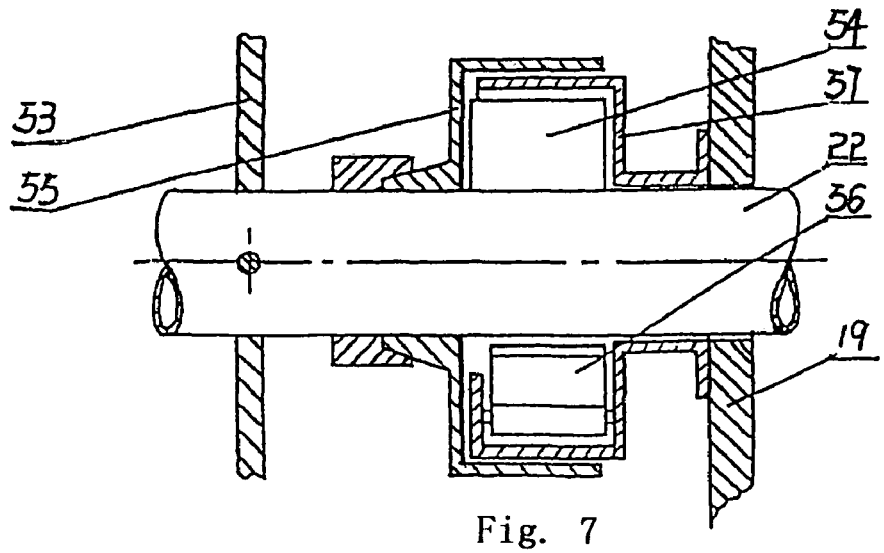
FIG. 7 shows another assembly approach diagram of FIG. 6.

FIG. 7 is another assemble approach diagram of FIG. 6. Most of components may exchange between being moveable and unmoved except the collecting mirror frame 53 and the collecting carrier 19. For example, the chamber shell 55 is unmoved in FIG. 6, but will revolve with the hinge shaft 22 and the collecting mirror frame 53 in FIG. 7; the valve shell 57 is moveable in FIG. 6 but unmoved for being fixed with the collecting carrier in FIG. 7; the plate 54 is unmoved in FIG. 6, but moveable for being fixed with the hinge shaft 22 in FIG. 7; and so on. And the valve 56 is always carried by the valve shell 57 to have a moveable connection between them.

Figure 8:
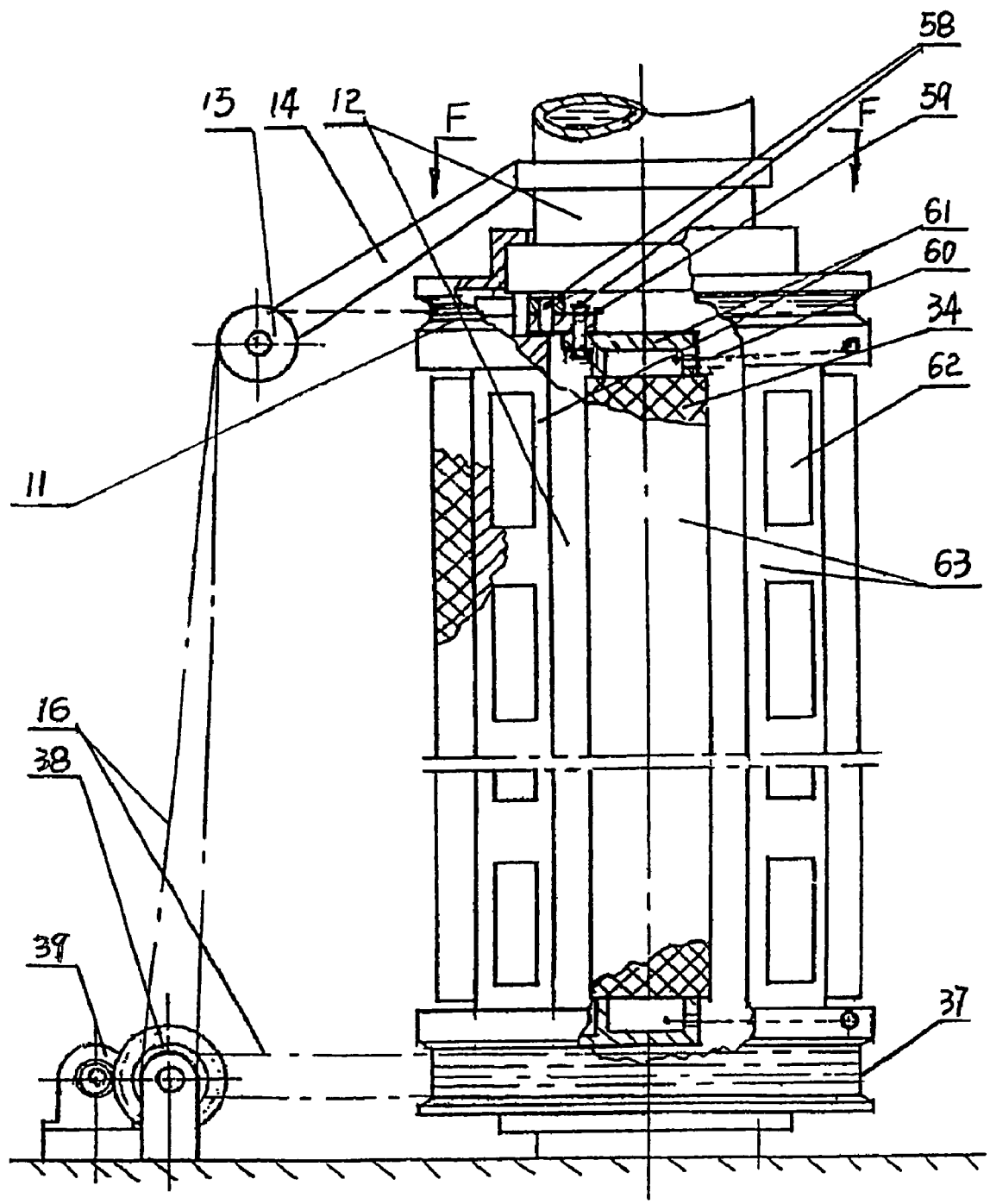
FIG. 8 is the front view of the isolation absorptive covering-uncovering component in the sixth embodiment.
Figure 9:
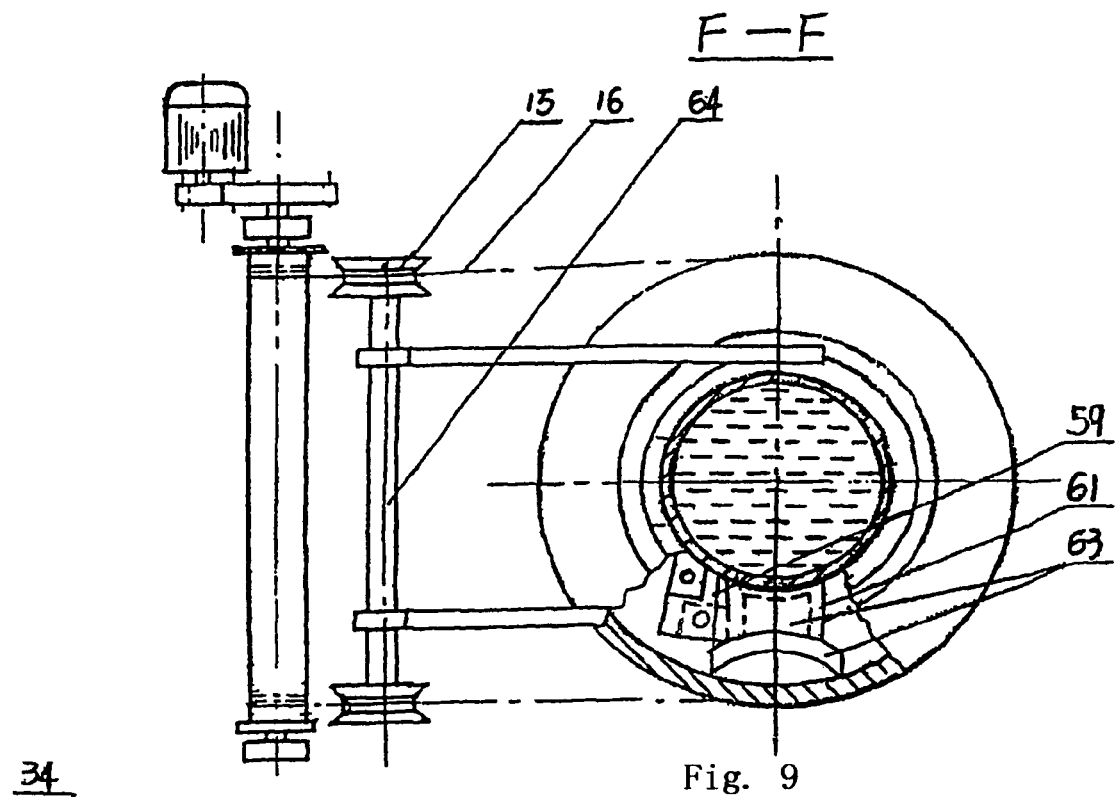
FIG. 9 is the top view of FIG. 8.

FIG. 8 and FIG. 9 are respectively the front view and the top view of the isolation absorptive covering-uncovering component. In FIG. 8 and FIG. 9, reference number "58" are pins, the horizontal upright plate 59 is hinged to the wind power generator frame 12 or the hollow support column 46, the rolling component 60 is connected to the rounding ring 11 and the isolative adsorption support plate 61, the ventilation windows 62 are located in both sides of the isolative adsorption support plate 61, the isolative adsorption plates 63 is constructed by the heat isolation layer 34 linked to the isolative adsorption support plate 61. FIG. 9 contains the top view of the isolative adsorption plates 63, and the isolative adsorption support plate 61 has the cross section like |_|, and is made of the high heat conductive material. The isolative adsorption support plate 61 includes a back surface agglutinate to the walls of the reserving and radiating chamber 32 or the cooling and heating chamber 35, two sides where there is ventilation windows, and a front surface with an open so as to spread and connect to the heat isolation layer 34. The both ends of the isolative adsorption plate 63 on one hand is hinged to the horizontal upright plate 59, and on the other hand is connected to the upper and lower rounding rings 11 and 37 by the rolling component 60. The rounding ring 11 or 37 consists of inner ring and outer ring which connect to each other, and the inner ring has a moveable connection with and revolves around and is carried by the wall of the reserving and radiating chamber 32 or the cooling and heating chamber 35. The rolling component 16 surrounds and is fixed to the outer ring; and the two ends of the rolling component 16 connected to the upper rounding ring 11 are connected to the rounding reel 38 after rounding the pulley 15 and after the rounding reel 38 surrounding in the opposite direction, and the other two ends of the rolling component 16 connected to the lower rounding ring 37 are connected to the rounding reel 38 by the same way as above. The rounding reel 38 has a torque transmission connection with the driving assembly 39 which contains a prime mover and a gearbox assembly. The driving assembly 39 is connected to the sensor or signal controller.

In FIG. 8 and FIG. 9, the back of the isolation absorptive plate sticks fitly to the wall of the reserving and radiating chamber 32 or the cooling and heating chamber 35, i.e. the reserving and radiating chamber or the cooling and heating chamber in the state of radiating or absorbing heat. In this situation, most of the isolation absorptive plates become heat radiators or absorbers, in which the heat radiation or absorption depends on the higher or lower temperature of media compared to the environmental temperature. The heat absorption is used for this invention which contains a heat pump and has synchronous generation function to heat and solar power generation. When there is no sunlight, the heat pump works to make the temperature of the reserving and radiating chamber or the cooling and heating chamber over-low, which leads to the decreased absorptive efficiency of heat pump. In this case, the temperatures of the two cavities are lower than the environmental temperature, and more heat must be absorbed from environment for the heat production of heat pump. The heat from environment is collected in the cavities by many isolation absorptive plates to increase the temperature of the media inside the cavities. Since the enthalpy content of the media is higher than that of atmosphere, this can make the efficiency of heat pump higher than that of gas heat pump.

When the system works and generates electrical power in the day time, the sensor or signal controller drives the isolation absorptive plate 63 rotate clockwise shown in FIG. 9 via the driving assembly 39 and the upper, lower rounding rings in order to keep cold for the two cavities described above. At this rate, the each isolation absorptive plates turn over 180°, and the heat isolation layer 34 sticks fully to the walls of the two cavities so as to protect the environmental heat entering, so the plate in this system is called as isolation absorptive plate.

Figure 10:
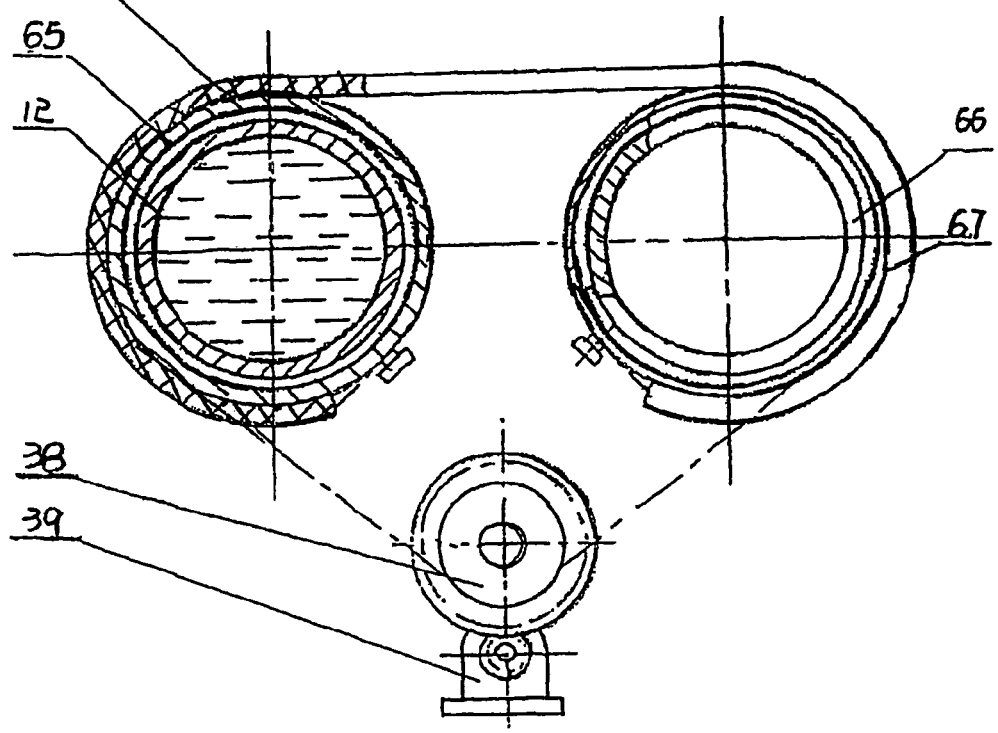
FIG. 10 is the top view of the rolling covering-uncovering component in the seventh embodiment.

FIG. 10 is the top view of the rolling covering-uncovering component. In FIG. 10, the sub-support column 66 is parallel to the wind power generator frame 12, the sub-tube 67 sets in and can revolve around the sub-support column 66, the main tube 65 sets in and can revolve around the wind power generator frame 12. One end of the heat isolation layer 34 is fixed around the main tube 65, and the other end of it is fixed around the sub-tube 67. The rolling wheel 38 has a torque transmission connection with the main tube 65 and the sub-tube 67, and has a torque transmission connection with the driving assembly 39 with a gearbox, and the driving assembly 39 is controlled by the signal controller or sensor. Both the main tube and the sub-tube may be in a shape of stockade or grid, the heat isolation layer 34 can coil into the main tube 65 so as to cover the frame 12 to isolate heat, and coil into the sub-tube 67 so as to uncover the frame 12 to radiate heat.

An alternative rounding covering-uncovering component is configured by linking one end of the heat isolation layer 34 to the rolling component without the main tube 65, the other end of the heat isolation layer 34 is still fixed at sub-tube 67, with the other end of the rolling component fixed to the wind power generator frame 12 or the hollow support column 46 after sounding them. When the wind power generator frame 12 or the hollow support column 46 is uncovered to radiate heat, the driving assembly revolves the sub-tube 67 which is surrounded by the heat isolation layer, so that the rolling component can be stretched more than an whole round around wind power generator frame 12 or the hollow support column 46. When the wind power generator frame 12 or the hollow support column 46 is covered to isolate heat, the driving assembly will release the sub-tube 67, so that the heat isolation layer will re-surround the wind power generator frame 12 or the hollow support column 46 through the flexible tension of the rolling component.

Figure 11:
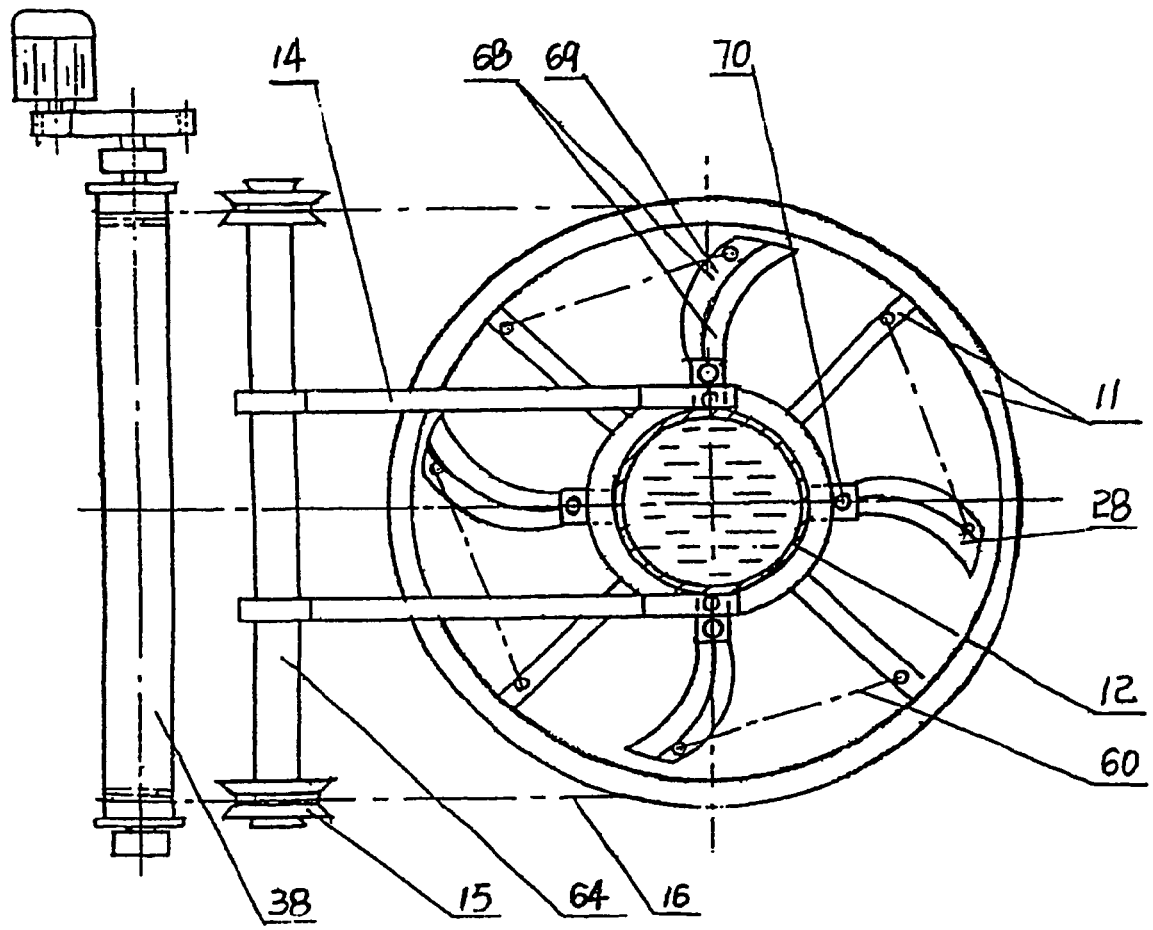
FIG. 11 is the top view of the rotary vane covering-uncovering component in the eighth embodiment according to the present invention.

FIG. 11 is the top view of the rotary vane covering-uncovering component whose front view is included in FIG. 2 or FIG. 4. In FIG. 11, the rounding ring 11 consists of an inner ring, an outer ring and a link spoke, and the inner ring is movably connected to the wind power generator frame 12 to revolve around and is carried by it. The outer ring of the rounding ring 11 is coiled several rounds by the rounding ring whose end is fixed to the rounding ring 11 and another end coils the pulley 15 to be fixed to the rounding wheel 38 after surrounding it several rounds (see FIG. 4), and the rounding wheel 38 has a torque transmission connection with the driving assembly 39 via the gearbox assembly. The heat isolation vane 68 is hinged to the wind power generator or the external hollow support column 46 with the hinge shaft 70, and consists of the vane support plate 69 and the heat isolation layer 34, and is connected to the rounding ring 11 by the rolling component 60. For example, in FIG. 11, if the rounding ring turns an angel clockwise, all the heat vanes is pulled to a lying down state so as to cover the frame 12 to isolate heat. In FIG. 11, the heat radiation state or absorption state to outer environment by the two cavities contained in the frame 12 is described.

Figure 12:
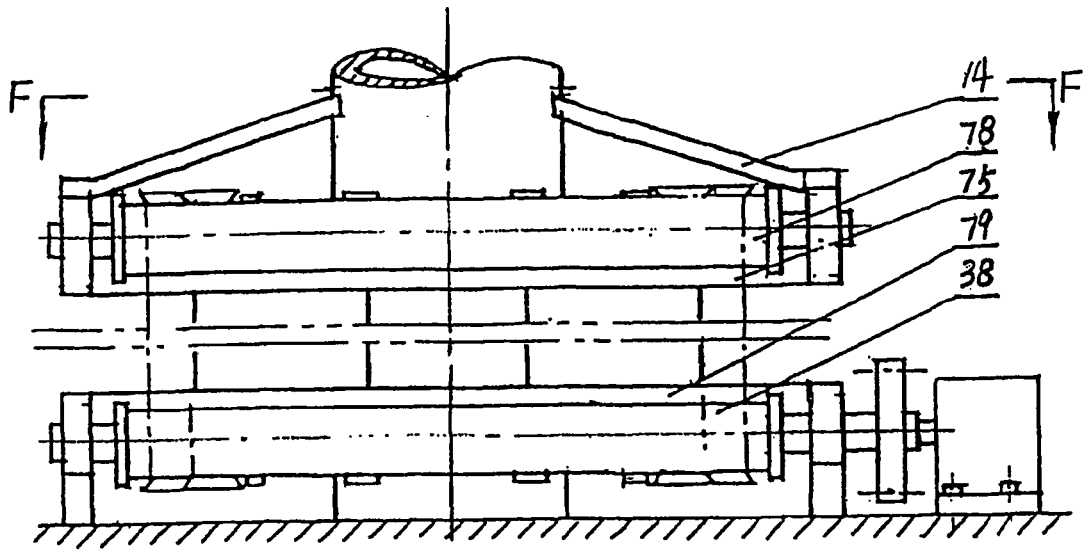
FIG. 12 is the front view of the push-pull covering-uncovering component in the ninth embodiment according to the invention.
Figure 13:
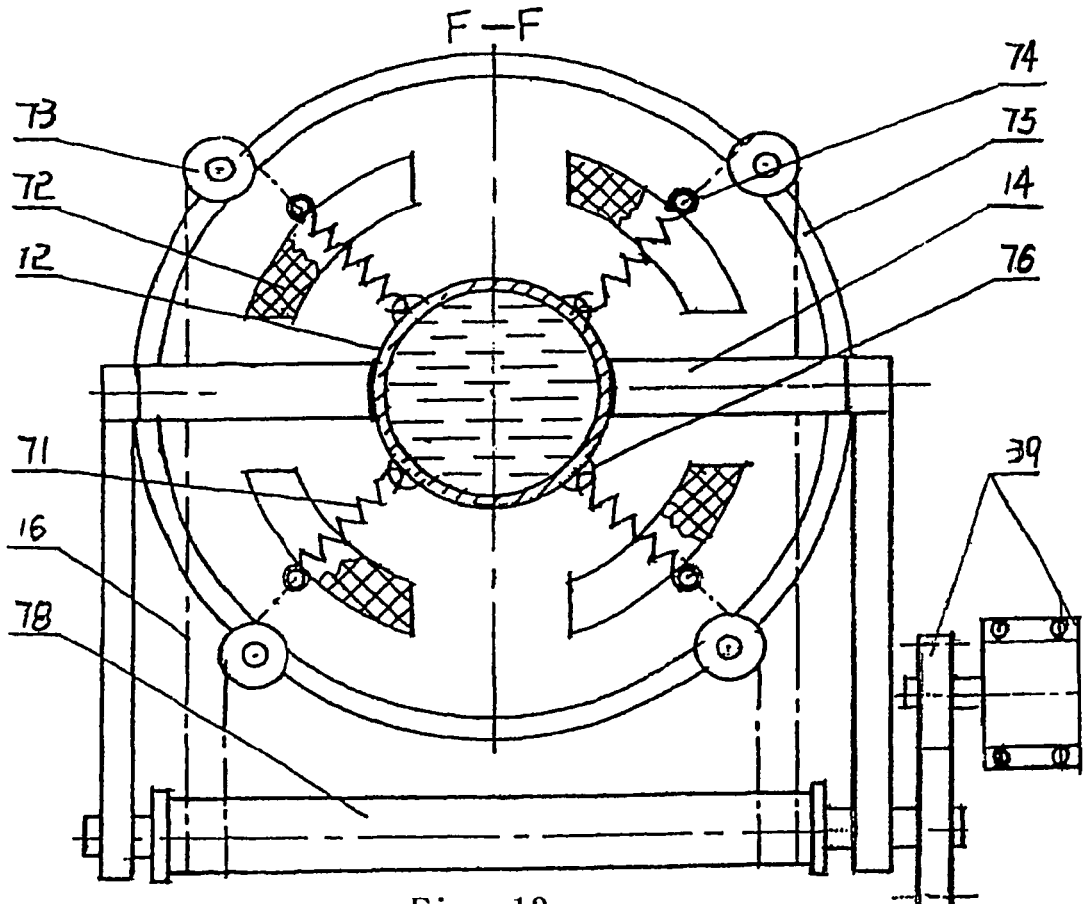
FIG. 13 is the top view of FIG. 12.

FIG. 13 and FIG. 12 shows the forth embodiment of the covering-uncovering component, i.e. the top view and the front view of push-pull covering-uncovering component. The heat isolation petal pile 74 is used to fix the upper end of the rolling component 11, the external fixity 75 is fixed in the support column or wind power generator frame 61 via the upper frame 14, the internal fixity 76 is a ring fixed to the support column 12. One end of the spring 71 is connected to the internal fixity 76, and another end is connected to the heat isolation 74. The rolling component 16 is connected to the rolling wheel 38 shown in FIG. 22 after surrounding via the pulley 73 and the revolving component 78, the rolling wheel 38 has a torque transmission connection with the driving assembly 39 via the gearbox. The central distance between the revolving component 78 and the upper external fixity 75 and the central distance between the rolling wheel 38 and the lower external fixity 79 will not change along with the time. The gearbox must be in series connect with a turbine wheel pole (not shown). When the reserving and radiating chamber and the cooling and heating chamber inside the support column 12 radiate heat after the electrical motor 39 uncovers the heat isolation petal 72, it will keep unchangeable in the state in FIG. 13. When the electrical motor 39 reverses, the spring 71 (shown as an extension spring) drives the heat isolation petal 72 to cover hollow support column 12 to isolate heat.

Figure 14:
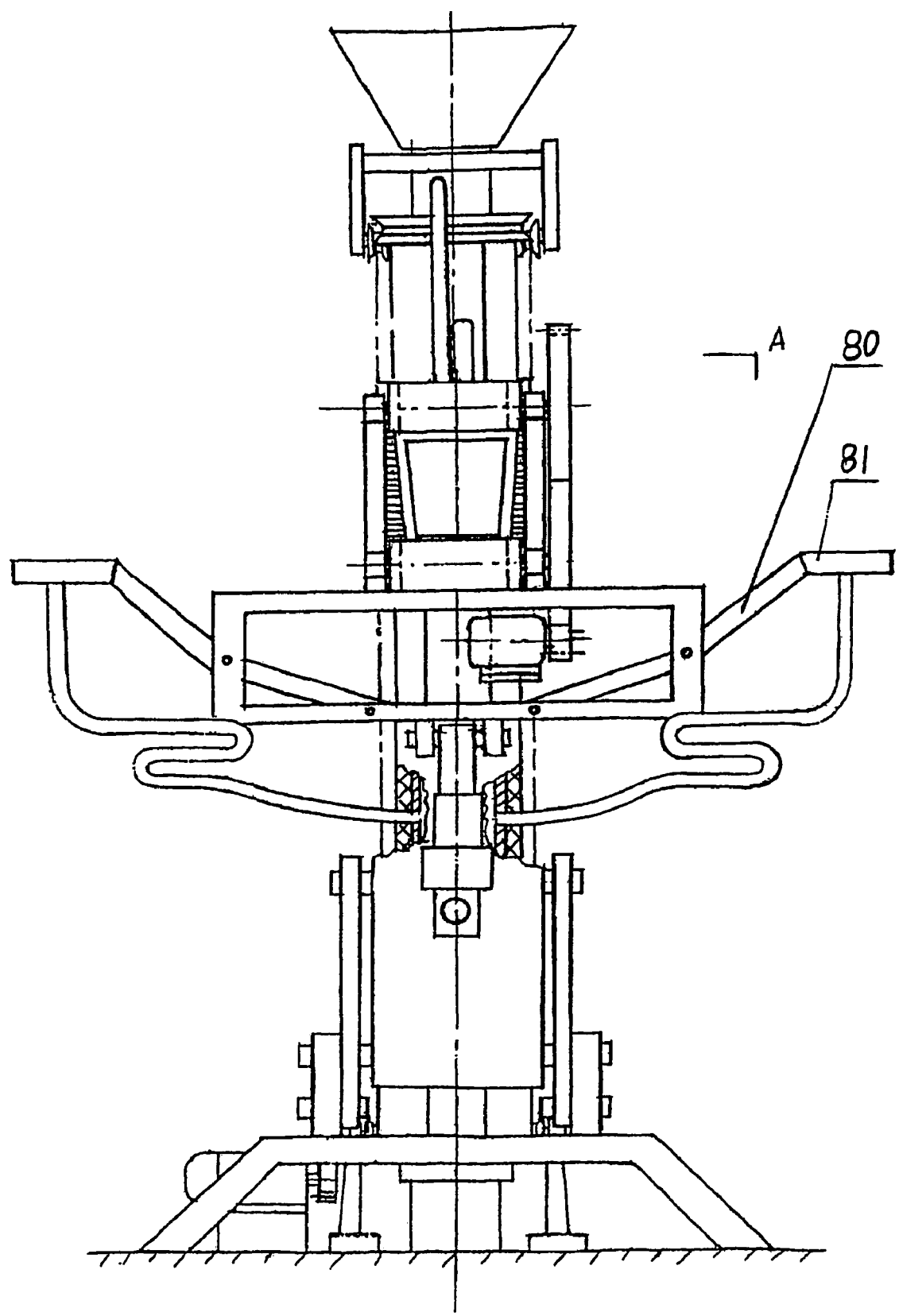
FIG. 14 shows the tenth embodiment with the absorptive cooling system and fixed collecting mirrors according to this invention.
Figure 15:
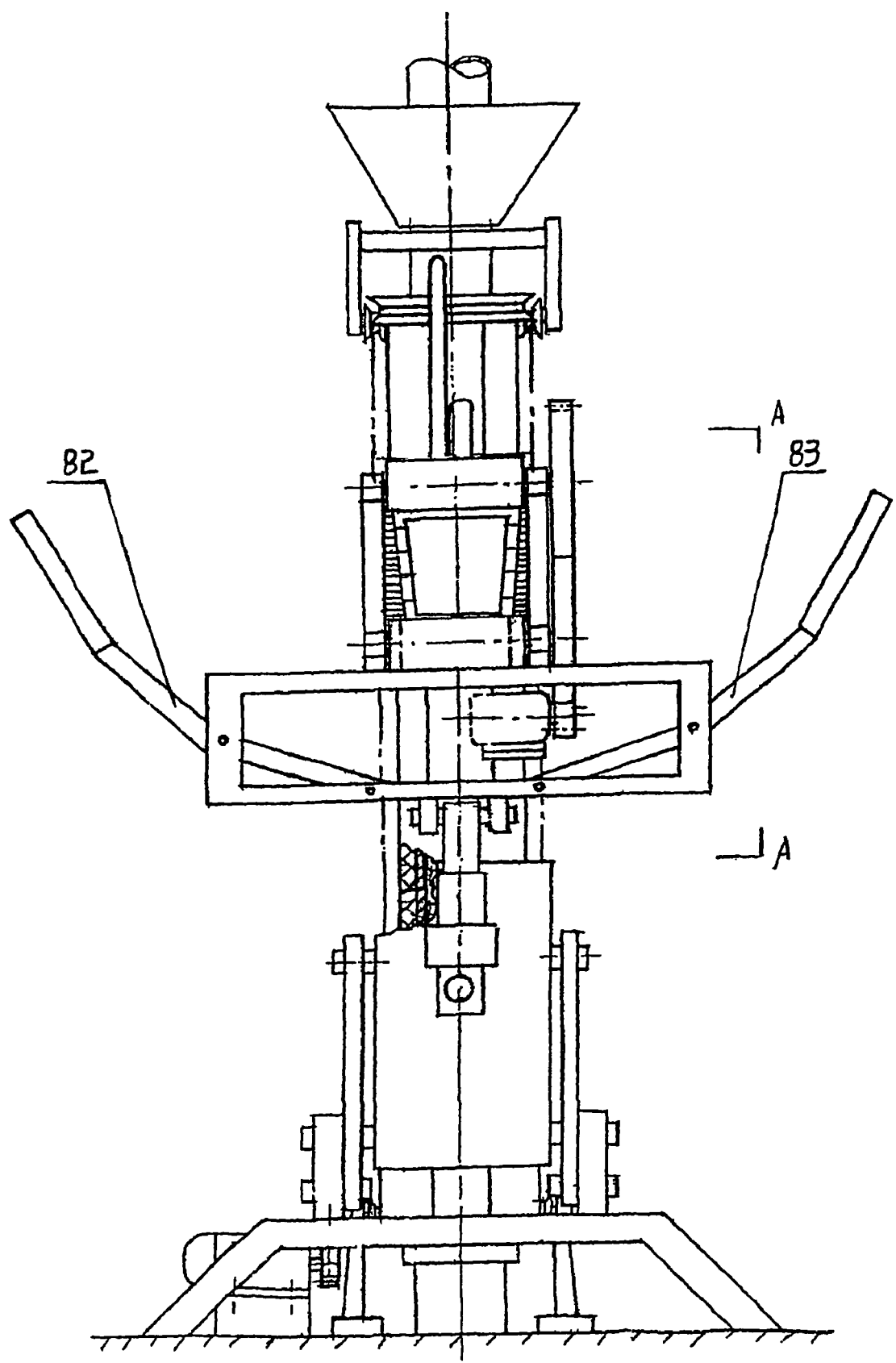
FIG. 15 shows the 11th embodiment by replacing the hinged collecting mirrors with fixed collecting mirrors according to this invention.

FIG. 14 and FIG. 15 show the changed made by using the fixed connection collecting mirrors instead of the hinged collecting mirrors and some components relevant to hinge connection, with the rest of components unchanged. FIG. 14 shows an adsorptive cooling component as an adsorption-desorbing chamber which is involved in the main collecting mirrors 80 and the flat anti-wind plate 81. In FIG. 15, reference number "82" is representative of the west collecting mirrors, and reference number "83" is representative of the east collecting mirrors. For lacking of automatic storm-sheltering and anti-shake functions, the fixed collecting mirrors must rely on the relevant function of automatic sun-tracking machine to protect the collecting mirror and the whole system from the storm. For example, such automatic sun-tracking machine is driven by two electrical motors (double-axes tracking), and the controller of the automatic sun-tracking machine must have automatic storm-sheltering circuit and wind driven sensor etc. When the system meets a storm, the automatic sun-tracking machine will turn to the transit position in FIG. 15, to face a smaller wind resistance of the collecting mirrors (but bigger than wind resistance of the automatic moveable hinged mirrors), accordingly the cost of the automatic sun-tracking machine or the whole device will increase. The problem of the automatic sun-tracking machine which has this function has been solved by some existed technologies, so it won't be described herein.

This invention relates to a medium multiple collecting solar power generation, and in particular, a system which contains a heat pump and has synchronous generation function to heat and solar power generation, has a great benefit.

Besides the compressed heat pump described above, other heat pumps can be used in the system in this invention, for example, absorbing heat pump, adsorption heat pump, electromagnetic heat pump, metal hydride heat pump etc.

The advantages to this invention are:
1. High efficiency of solar power generation: as the efficiency of solar PV power generation depends on the working temperature, this invention applies an ingenious and cheap approach to make cold, for example using the covering-uncovering system which can utilize the temperature difference between day and night to make cold, this approach almost costs nothing, and can produce great cooling energy and get a high conversion efficiency of PV cells for power generation just by actuating the drive motor to work a few or several dozens seconds in one day.
2. This invention can utilize the direct sunlight and part of the diffuse sunlight, and can be used in wide areas.
3. The medium multiple light collecting can save the consumption of the solar PV cells and decrease the capability requirement of the PV cells, and also can decrease the cost of power generation.
4. It is safe and reliable to protect the system from the storm damage: as the hinged collecting mirror can escape from the storm automatically, and a brilliant anti-shake system is also applied in this invention so that any storm will not damage the glass component and PV cells.
5. The flat reflection mirror increases greatly the light density of the PV cells, so at to get an even light density and a higher packing factor, and the collecting mirrors can be made easily and at a low cost.
6. The solar PV cells are automatically cleaned off the leaves, snow, guano, dust, which overcomes the "heat island effect" in the traditional solar power generation.

7. Longer use-life of the solar PV cells: as this invention can keep the temperature of solar PV cells lower than the environmental temperature, which solves the problem "heat island effect".
8. The solar power generation and the heat production work at the same time, benefit mutually, this invention also overcomes a problem that how to make heat efficiently by using the solar power when there is not sunlight.
9. This invention can integrate wind power and solar power generation, and can overcome the discontinuously working problem in wind power or solar power generation; it is convenient to use, and can decrease the electricity losing time to accumulator so as to longer the use life; at the same time, to use controller, inverter, accumulator etc. simultaneously may decrease half of the cost on these instruments and increase the efficiency of utilization, so as to decrease the relevant cost of solar power generation.

What is claimed is:

1. An upright-plate type sunlight highly efficient generator, comprising an upright-plate photovoltaic (PV) solar power generating tube which automatically cleans dust, a light collecting mirror provided with an automatic storm-sheltering mechanism and a collecting carrier, a cooling and radiating system, an automatic sun-tracking machine and its object carrier, wherein:

the collecting carrier is fixed in the object carrier which is connected movably to the automatic sun-tracking machine, wherein a connecting approach between a collecting mirrors group and the collecting carrier or the object carrier is a movable connection comprising a hinged connection, the solar PV power generating tube in the focus area of the collecting mirrors group is supported by and connected to the collecting carrier during the working time;

the collecting mirrors are folding mirrors which consist of a group of flat mirrors;

the cross section of the upright-plate PV power generating tube is wedge-shaped or rectangular or square, that is, there are at least two lines of the cross section are straight lines in the plane connected to the solar PV cells plane which is parallel or nearly parallel to sunlight, wherein the upright-plate power generating tube has an empty inner chamber called as "liquid cooling chamber" in which a cooling liquid flows, and there are at least two connectors at both ends of the tube for connecting to the top and bottom connectors of a reserving and radiating chamber respectively through two flexible connecting pipes;

hinged collecting mirrors consist of the collecting mirror components which comprise double components, and the collecting mirrors are provided with an automatic storm-sheltering mechanism;

the hinged double mirror components consist of main collecting mirror and sub-collecting mirror, the main mirror is the collecting mirror which is hinged to the collecting carrier, the sub-collecting mirror is installed in the main collecting mirror and comprises mirror sheets installed in frame, a restoring spring, a hinge shaft, and an anti-shake system, wherein the sub-mirror comprises a sub-mirror frame that is connected to the main mirror at a main mirror frame by a hinge, the restoring spring is connected to the main mirror and sub-mirror frames at both ends respectively, and the cooling and radiating system is a liquid cooling system which consists of a liquid cooling chamber, a flexible connecting pipe, and liquid reserving and cooling components, wherein at least two connectors are connected to the flexible connecting pipes at both ends of the liquid cooling chamber, and at least two flexible connecting pipes lie at the top and at the bottom, and wherein the connector between the bottom connecting pipe and the reserving and cooling component is higher than a vertex of the upright plate PV power generating tube, and the top and bottom connecting pipes are communicated with media in the reserving and cooling components;

wherein the anti-shake system is a hydraulic anti-shake system, the hydraulic anti-shake system is installed between a hinge support and a hinge linker, the hinge shaft may be fixed at a hinge support shaft or at a rotated shaft or a linker, and the hydraulic anti-shake system comprises a chamber shell, a baffle, a valve, and a valve shell;

wherein the baffle is fixed at the center shaft which is connected with the hinge support so that the chamber shell traverses to make a seal and unmovable connection with the center shaft, and contains parts of the baffle and the valve shell so as to make a seal and movable connection with the parts, and wherein the valve makes a movable connection with the valve shell which is the carrier of the valve, and the space between the valve and the baffle can be enlarged or reduced, and wherein the valve shell is fixed to the hinge linker so as to make a movable seal with the center shaft, and a working media is filled among the chamber shell, the center shaft, and the valve shell.

2. The upright-plate type sunlight highly efficient generator according to claim 1, wherein the two surfaces of the upright plate PV power generating tube are in a touchable or an untouchable state to a dust cleaner, and the dust cleaner comprises a cleaning component, clamping assemblies, a torque transmission component, drive assemblies, and a signal controller, and the cleaning component consists of a dust cleaning head, a carrying plate or a circle, wherein the cleaning head is made of flexible material with or without electric fuse, the clamping assemblies on one hand make a torque transmission connection with the carrier of the cleaning head so as to keep the cleaning head in touch with the PV cells at the working time, while on the other hand connect to the torque transmission component which consists of a position wheel and a rolling component at the two ends of the PV power generating tube, and wherein the torque transmission wheel is fixed at the axis of the position wheel which drives the rolling component move repeatedly and is located at one end of PV power generating tube, the torque transmission wheel makes a torque transmission connection with the drive assemblies which are controlled by the signal controller.

3. The upright-plate type sunlight highly efficient generator according to claim 1, wherein the automatic storm-sheltering mechanism comprises a driving component which is a wind driven component, wherein the wind driven component is a dissymmetric configuration in the hinge shaft of the main mirror plate in the hinged double mirror components, the hinge linker is divided into different size parts by the hinge shaft, and wherein the sub-mirror in the hinged double mirror components is connected to a small part of the main mirror with a hinge.

4. The upright-plate type sunlight highly efficient generator according to claim 1, wherein the liquid reserving and cooling components comprise a system for reserving heat from the media and for exchanging the heat with the liquid cooling chamber to cool the media.

5. The upright-plate type sunlight highly efficient generator according to claim 4, wherein the liquid reserving and cooling component is an integrated reserving and cooling system comprising at least one of: an evaporative reserving and cooling component, a chamber reserving and cooling component, metal hydride reserving and cooling component and day-night different temperature reserving and cooling component;

wherein:

the chamber reserving and cooling component is a chamber which reserves the liquid, radiates the heat and cools the liquid cooling chamber, wherein the chamber reserving and cooling component is the upper section of the support frame of wind power generator, called reserving and radiating chamber, or is an outer reserving and cooling chamber located outside the support frame of the wind power generator; at least two flexible connecting pipes communicate the reserving and radiating chamber with the liquid cooling chamber, wherein one connecting pipe is connected to the reserving and radiating chamber at the bottom and is made of heat isolation material or is surrounded by heat isolation material, while another flexible connecting pipe is connected to the reserving and radiating chamber at the top, the evaporation reserving and cooling component is connected above the chamber reserving and cooling component;

the evaporation reserving and cooling component includes a reserving and radiating chamber and an evaporating chamber connected thereto, wherein the evaporating chamber can be carried by and surrounds the walls of the reserving and radiating chamber either, and the evaporating chamber under the wind wheel has an open with the open area surrounding the walls of the reserving and radiating chamber in which the liquid flows, and wherein the evaporating chamber can further comprise an outer evaporator outside the wind power generator;

the day-night temperature difference reserving and cooling component includes a reserving and radiating chamber, a cooling and heating chamber, a covering-uncovering component, and a heat absorption transmission component, wherein the cooling and heating chamber may be a chamber of the lower frame of the wind power generator or a chamber outside the wind power generator called the outer cooling and heating chamber; wherein the absorption transmission component is a heat exchanging component between the cooling and heating chamber and the reserving and radiating chamber, or is a liquid cycle tube made of the high conductive material; and wherein the covering-uncovering component is installed around the reserving and radiating chamber or a cooling and heating chamber to cover and reserve heat or cool for them according their need, or to uncover them to absorb or radiate heat.

6. The upright-plate type sunlight highly efficient generator according to claim 5, wherein the covering-uncovering component is an absorptive covering-uncovering component that includes a horizontal up-right plate, an absorptive plate, a rounding ring, a flexible force transmission component, and a driving assembly, and the absorptive covering-uncovering component further includes a signal controller, a sensor and a rolling component, wherein the horizontal up-right plate hinges to the walls of the cooling and heating chamber or the reserving and radiating chamber, and is moveably connected with isolation absorptive plate which prevents the heat transmission between the walls of the cooling and heating chamber or the walls of the reserving and radiating chamber and the environment, and become a radiator of the walls of the cooling and heating chamber or the reserving and radiating chamber, or become a heat absorption from the outer environment when the temperature of the heat absorptive end of the heat pump is very low, there are open holes which have windows in both sides and support and connect the heat isolation material at the front of the isolation absorptive plate, the back of the plate has a touchable or untouchable connection with the walls of the cooling and heating chamber or the reserving and radiating chamber, the plate is connected to the rounding ring by the flexible rolling component, and the rounding ring has inner or outer rings connected to each other, the inner ring is carried by and rotated surrounding the walls of the cooling and heating chamber or the reserving and radiating chamber, the outer ring has a direct or indirect torque transmission connection with the driving assembly by the torque transmission component, the driving assembly is controlled by the signal controller or sensor.

7. The upright-plate type sunlight highly efficient generator according to claim 5 further comprising a reconstructed wind power generator.

* * * * *